United States Patent
Schrank

(10) Patent No.: US 7,923,792 B2
(45) Date of Patent: Apr. 12, 2011

(54) MEMS SENSOR COMPRISING A DEFORMATION-FREE BACK ELECTRODE

(75) Inventor: Franz Schrank, Graz (AT)

(73) Assignee: austruamicrosystems AG, Unterpremstaätten (AT)

( * ) Notice: Subject to any disclaimer, the term of this patent is extended or adjusted under 35 U.S.C. 154(b) by 226 days.

(21) Appl. No.: 12/087,712

(22) PCT Filed: Jan. 10, 2007

(86) PCT No.: PCT/EP2007/000173
§ 371 (c)(1),
(2), (4) Date: Nov. 24, 2008

(87) PCT Pub. No.: WO2007/082662
PCT Pub. Date: Jul. 26, 2007

(65) Prior Publication Data
US 2009/0309171 A1    Dec. 17, 2009

(30) Foreign Application Priority Data
Jan. 11, 2006  (DE) .................. 10 2006 001 493

(51) Int. Cl.
*H01L 29/84* (2006.01)
(52) U.S. Cl. ........ 257/415; 257/414; 257/416; 257/417; 257/418; 257/419; 257/420; 257/E29.324; 257/252; 257/254; 438/50

(58) Field of Classification Search ............... None
See application file for complete search history.

(56) References Cited

U.S. PATENT DOCUMENTS

| | | | |
|---|---|---|---|
| 5,573,679 A | 11/1996 | Mitchell et al. | |
| 6,698,295 B1 | 3/2004 | Sherrer | |
| 6,743,654 B2 | 6/2004 | Coffa et al. | |
| 2002/0067663 A1 | 6/2002 | Loeppert et al. | |
| 2003/0155643 A1* | 8/2003 | Freidhoff | 257/704 |
| 2005/0101047 A1* | 5/2005 | Freeman et al. | 438/48 |

FOREIGN PATENT DOCUMENTS

| | | |
|---|---|---|
| DE | 102 06 711 | 8/2003 |
| EP | 0 454 883 | 5/1990 |
| EP | 0 455 070 | 4/1991 |
| JP | 2004-82260 | 3/2004 |
| JP | 2004-160607 | 6/2004 |
| WO | WO 90/00735 | 1/1990 |

* cited by examiner

*Primary Examiner* — Minh-Loan T Tran
*Assistant Examiner* — Fei Fei Yeung Lopez
(74) *Attorney, Agent, or Firm* — Cohen Pontani Lieberman & Pavane LLP

(57) ABSTRACT

An MEMS sensor constructed on a base chip and having a capacitive mode of operation is disclosed. The MEMS sensor has a patterned layer construction applied on the base chip. A cutout is produced in the layer construction, the moveable electrode, for example a membrane, being arranged in said cutout. The cutout is spanned by a covering layer, which bears on the layer construction around the cutout and comprises the back electrode.

10 Claims, 4 Drawing Sheets

MEMS SENSOR COMPRISING A DEFORMATION-FREE BACK ELECTRODE

RELATED APPLICATIONS

This is a U.S. national stage under 35 USC 371 of application Ser. No. PCT/EP2007/000173 filed on Jan. 10, 2007.

This patent application claims the priority of German Patent Application no. 10 2006 001 493.6 filed Jan. 11, 2006 the entire content of which is hereby incorporated by reference.

FIELD OF THE INVENTION

The present application relates to a MEMS sensor having a capacitive mode of operation.

BACKGROUND OF THE INVENTION

MEMS sensors having a capacitive mode of operation such as can be used in particular as an inertia sensor, pressure sensor or microphone usually have, as a moveable electrode, a membrane or a reed which can be moved by the physical quantity to be determined. A counter electrode or back electrode is arranged at a defined distance with respect thereto.

In known MEMS sensors, the back electrode together with a mechanically stable layer carrying it forms a construction that projects above the base chip in cap-type fashion. In this case, one known material for the construction of the mechanically stable layer is silicon nitride. In stoichiometric form, it can be produced in a stable process with constant properties. What is disadvantageous, however, is that stoichiometrically produced silicon nitride produces a tensile stress that acts on the three-dimensional construction of the MEMS sensor and leads to the deformation thereof and thus also to a change in the position of the back electrode. As a consequence thereof, the distance between the moveable electrode and the back electrode is altered and in particular reduced. This adversely affects the sensitivity of the sensor since the construction deformed in the Z direction no longer has a defined distance between back electrode and moveable electrode. This makes it impossible to exactly measure the physical quantity to be determined.

SUMMARY OF THE INVENTION

One object of the present invention is to specify an MEMS sensor which avoids problems in this regard.

An MEMS sensor having a capacitive mode of operation is specified, which is constructed on a base chip. It comprises a patterned layer construction having a central cutout. A moveable electrode is provided within the cutout in the vicinity of the base chip. The cutout itself is spanned by a covering layer, which bears on the layer construction and which comprises the back electrode.

This sensor has the advantage that the covering layer bears on the layer construction in planar fashion and does not have a construction that is elevated three-dimensionally above the base chip or elevates the layer construction. Therefore, the tensile stresses possibly produced during the production of the covering layer act only in the plane of the covering layer. At the same time, the covering layer is held by the layer construction surrounding the cutout, thereby preventing a deformation of the covering layer and in particular of the back electrode layer. On the contrary, it is observed that tensile stresses occurring within the covering layer lead to a stabilization of the layer construction and lead to an increased stiffness of the back electrode. This enables the required mechanical stability and stiffness of the covering layer comprising the back electrode to be achieved even with smaller layer thicknesses than in known MEMS sensors.

A further advantage achieved with this arrangement is that for the covering layer it is possible to have recourse to materials that were sooner avoided in known MEMS sensors. By way of example, stoichiometric silicon nitride, which has already been mentioned in the introduction and which, during production, produces a significantly higher tensile stress than a non-stoichiometric silicon nitride with silicon excess, can now be used for the covering layer. Stoichiometric silicon nitride has the advantage that it is mechanically stable and can be produced in a stable process with layer properties that are uniform and reproducible in a constant fashion. By contrast, the substoichiometric silicon nitrides can only be produced in a non-stable process, which has the consequence that the process can be controlled only in a complicated manner and generally leads to material properties that are inhomogeneous or not exactly reproducible.

In the MEMS sensor proposed, the covering layer, in the region of the cutout, can be electrically conductive or comprises at least one electrically conductive partial layer. The partial layer can be composed of polysilicon, which can be highly doped in order to produce a sufficient electrical conductivity. The mechanically stable layer can then be formed from silicon nitride. The covering layer then comprises at least two layers. However, it is also possible for the covering layer to be embodied with a higher number of layers and to be realized in particular with a symmetrical layer construction. One possibility then consists in providing in the covering layer at least one polysilicon layer embedded between two partial layers composed of silicon nitride. In such a multilayer having a symmetrical construction, stresses can be optimally compensated for and a mechanically stable multilayer construction that exhibits no deformations whatsoever can thus be obtained.

In a region around the cutout in the layer construction, the covering layer or at least one partial layer of the covering layer is led as far as the surface of the base chip and terminates there with the base chip. Accordingly, all lateral areas of the cutout are delimited completely or laterally and at the top by the covering layer or one or a plurality of its partial layers. Only a part of the moveable electrode is directed through the partial layer or covering layer—which surrounds the cutout and is drawn down to the surface of the base chip—and is electrically contact-connected outside that. Directly adjacent to this region, that is to say further away from the cutout, the covering layer runs on the surface of the layer construction, such that it forms overall an approximately planar surface within which the tensile stresses can be optimally compensated for.

The moveable electrode can be formed as a reed that is arranged at a clear distance from the surface of the base chip and is fixed for example by one end in the layer construction. However, it is also possible to form the moveable electrode as a membrane that bears directly on the surface of the base chip. In this case, a perforation is provided in the base chip below the membrane, said perforation being covered by the membrane. It is thus possible to utilize the membrane for detecting pressure differences or as a microphone.

The electrode properties of the moveable electrode or of the membrane can be obtained by means of polysilicon established in conductive fashion. In this case, it is possible either to form the moveable electrode completely from polysilicon or to realize it as a combination of a polysilicon layer and one or a plurality of mechanically stable carrier layers or other layers if appropriate with a symmetrical construction.

An MEMS sensor formed as a microphone or pressure sensor can have a pattern of openings in the covering layer in the region of the cutout, such that the moveable electrode is indeed protected from mechanical influences by the covering layer but is connected to the ambient pressure through the openings.

Although a moveable electrode formed as a membrane bears freely on the surface of the base chip above the perforation, it is preferably fixed in this position and can be pressed against the base chip by membrane holders. For this purpose, protuberances into the cutout can be provided in the covering layer in the edge region of the membrane, which protuberances reach as far as directly over the surface of the membrane and therefore minimize the movement leeway thereof in the direction of back electrode or covering layer. This fixing of the membrane exclusively in the edge region thereof guarantees that it can deflect unimpeded in the central region.

A deflection of the membrane as far as the lower edge of the covering layer can occur both during the production process and during operation and lead to the membrane hooking together or even welding together with the covering layer, particularly if the underside of the covering layer and the top side of the membrane are formed from identical material, and in particular from polysilicon. This would lead to a blockade of the membrane and thus to a malfunction of the MEMS sensor. In order to prevent this, spacers in the form of inwardly pointing protuberances can be provided in the covering layer, which are distributed regularly in the covering layer in the region above the membrane. In order to avoid baking together of the two materials, said protuberances are not composed of polysilicon, but rather preferably of silicon nitride.

The layer construction comprises sacrificial layers, electrode layers and, if appropriate, structure material layers which are preferably in each case applied over the whole area during production. Electrode and structure material layers can be patterned or else planarized in a desired manner in each case after whole-area application. The use of sacrificial material serves, in particular, after the layer construction has been completely produced, for producing the cutout by stripping or etching out sacrificial layer material. A suitable material for a sacrificial layer comprises silicon oxide, which can be etched specifically with respect to many other materials. Doped glass layers can be stripped out wet-chemically in a particularly simple manner.

The invention is explained in more detail below on the basis of exemplary embodiments and the associated figures. The figures serve solely for illustrating the invention and have therefore been drawn up only schematically and not true to scale.

DETAILED DESCRIPTION OF THE DRAWINGS

The production of an MEMS sensor formed as a microphone is described below. The basis of the MEMS sensor is a base chip BC, which fulfils at least one mechanical carrier function. It is therefore formed from a mechanically stable and, in particular, warpage-resistant material, preferably from a crystalline material, and comprises a silicon wafer, for example. Accordingly, an MEMS sensor according to the invention is also not fabricated as an individual component, but rather at the wafer level, a multiplicity of MEMS sensors being processed in parallel on the wafer surface.

A layer construction SA is firstly produced, comprising a plurality of layer depositing and patterning steps. In the present exemplary embodiment, for this purpose, at least one first sacrificial layer OS1 is produced, a first polysilicon layer is produced thereabove, the membrane ME being patterned from said first polysilicon, and a second sacrificial layer OS2 is produced thereabove. Optionally, a planarization process can subsequently be carried out, for example a CMP process (chemical mechanical polishing), in order to obtain a planar surface for the further layer producing processes and in particular for the covering layer.

Figure 1:
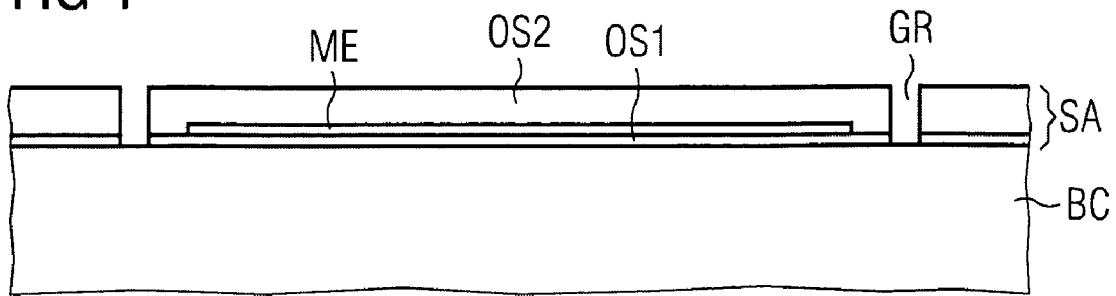
FIGS. 1 to 10 show various method stages in accordance with a first production variant.

FIG. 1 shows, on the basis of a schematic cross section, the arrangement in the region of an individual MEMS sensor, in which a trench GR has already been produced around the membrane ME in the layer construction SA, the surface of the base chip BC being uncovered in said trench. The membrane ME has an arbitrary, preferably a round or rectangular basic area and continues with a narrow lead into the layer construction SA (not illustrated in the figure). Accordingly, the trench GR, in a manner dependent on the membrane basic area, is also led as a closed circle or closed rectangle around the membrane.

Figure 2:
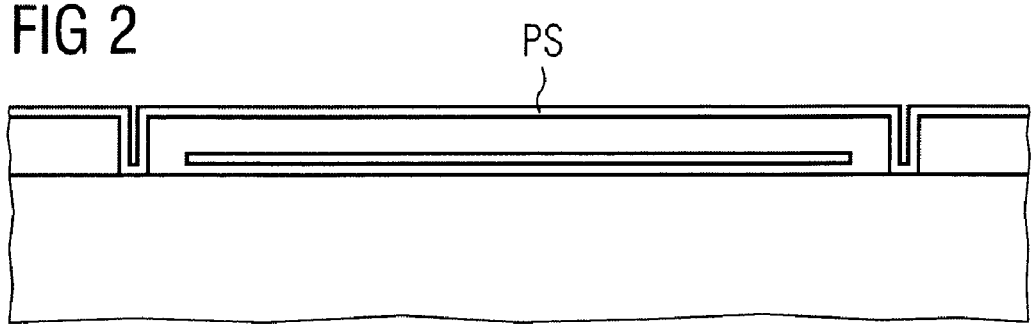

In the next step, a second polysilicon layer PS is deposited on the surface in edge-covering fashion in such a way that the trench GR is also lined by the polysilicon layer at sidewalls and the bottom. FIG. 2 shows the arrangement at this method stage.

The polysilicon layer PS can be produced in highly doped fashion or subsequently be doped by means of a suitable method, as will be illustrated later in an exemplary fashion with reference to FIG. 4, for example.

Figure 3:
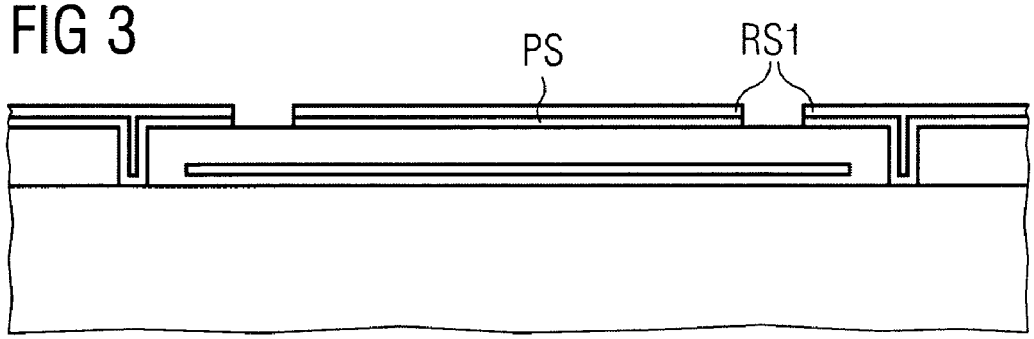

FIG. 3 shows the patterning of the second polysilicon layer PS, which is carried out by means of a likewise patterned resist layer RS1. Any method suitable for etching silicon, for example reactive ion etching, can be used for the patterning.

Figure 4:
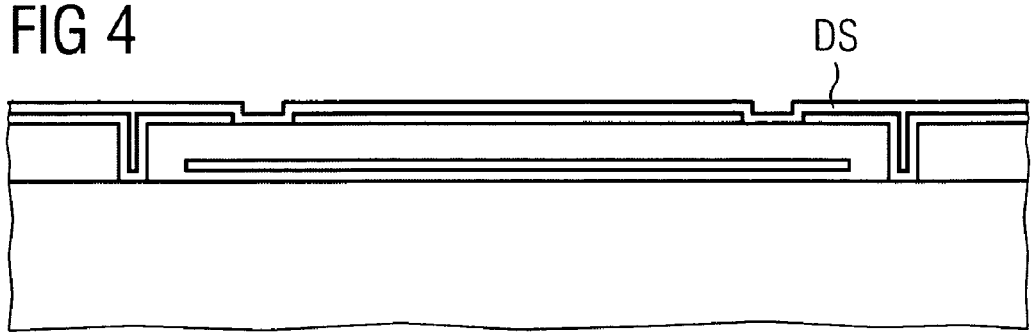

FIG. 4 shows a dielectric auxiliary layer DS, preferably a further sacrificial layer, which is applied on the entire surface in edge-covering fashion after the removal of the resist layer RS 1. In one method variant, said sacrificial layer DS can be a highly doped silicon oxide layer, with the aid of which dopant can subsequently be driven into the second polysilicon layer PS in an annealing step. In this case, the width of the trench narrowed by the first polysilicon layer PS is chosen to be sufficient to enable filling with said dielectric sacrificial layer. In one exemplary embodiment, the dielectric sacrificial layer DS is composed of phosphosilicate glass.

Figure 5:
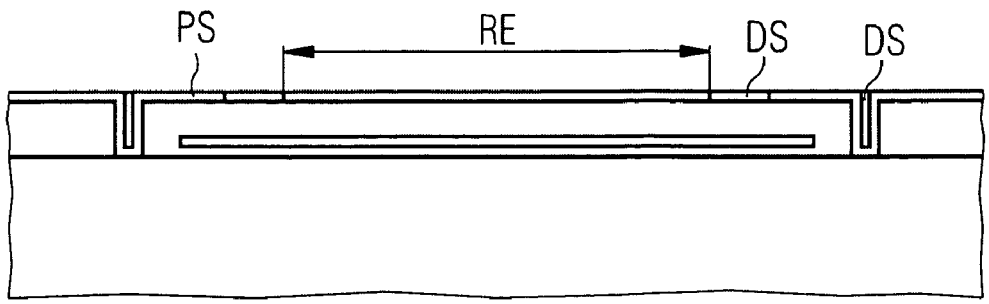

FIG. 5 shows the arrangement after planarization of the surface, which can be done for example once again by means of a CMP method. The surface of the second polysilicon layer PS is uncovered in this case. In the same way as the possibly remaining trench GR, the patterning trench of the second piezoelectric layer, which patterning trench separates the back electrode from the remaining region of the polysilicon layer, is now filled with the dielectric sacrificial layer DS.

Figure 6:
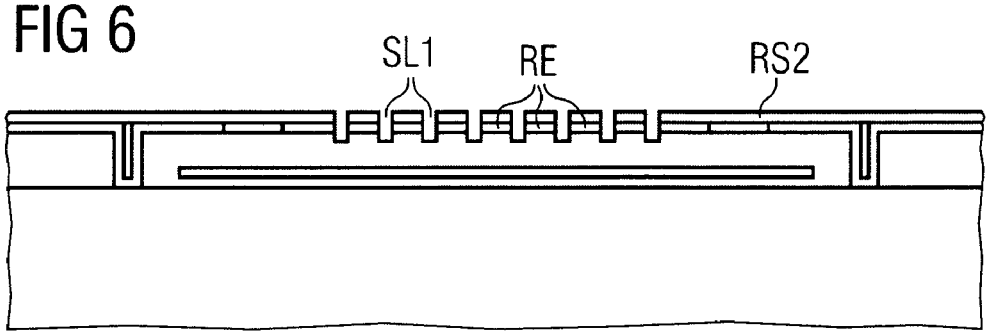

In the step shown in FIG. 6, a pattern of openings in the form of blind holes SL1 which are distributed uniformly in the region of the back electrode patterned from the polysilicon layer PS is then produced in a manner reaching into the surface of the polysilicon layer right into the sacrificial layer of the layer construction.

For this purpose, a patterned resist layer RS2 is used and a suitable etching method for polysilicon and for the underlying sacrificial layer is used.

In the next step, further blind holes SL2 are etched in order to produce the membrane mount. A further resist layer RS3 provided outside the second polysilicon layer PS patterned to form the back electrode RE is used for this purpose.

Figure 7:
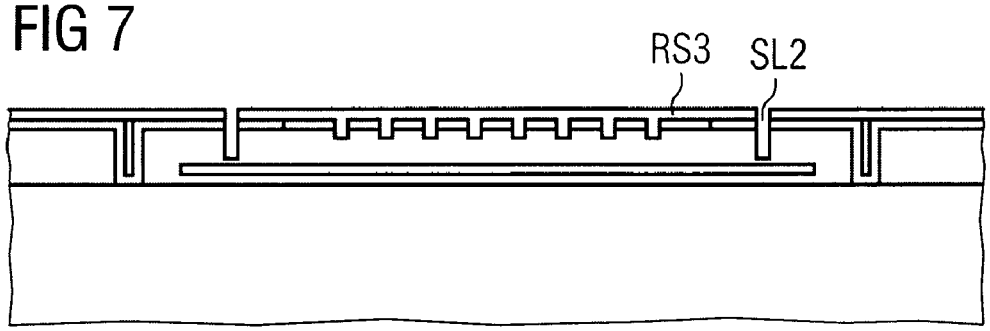

The further blind holes SL2 shown in FIG. 7 are etched to a depth just above the surface of the membrane ME. When seen in a plan view of the sensor as it is shown in FIG. 7, the further blind holes SL2 are preferably distributed uniformly along the edge region of the membrane ME.

After the removal of the resist layer RS3, a mechanically stable partial layer of the covering layer is deposited, for which purpose stoichiometric silicon nitride, in particular, is used. As an alternative to the silicon nitride, it is also possible to use any other mechanically stable material which can be etched specifically with respect to the sacrificial material and in particular specifically with respect to the silicon oxide used therefor.

Figure 8:
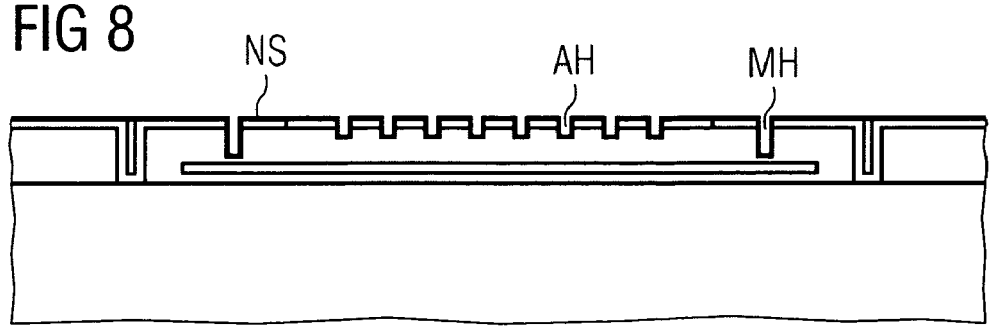

The deposition is effected in edge-covering fashion, such that, as illustrated in FIG. 8, both the first blind holes and the second blind holes are lined with the silicon nitride layer NS at sidewalls and bottoms. Said layer then forms the spacers AH in the first blind holes, and in contrast the membrane holders MH in the second blind holes. Spacers AH and membrane holders MH differ in particular by virtue of the depth reaching into the layer construction SA and can otherwise be formed identically. Therefore, the order when producing the corresponding blind holes is also interchangeable. As an alternative to the production variant described above, the second blind holes can also be produced before the first blind holes in patterning steps that differ from one another. Both cases lead to the construction illustrated in FIG. 8.

Figure 9:
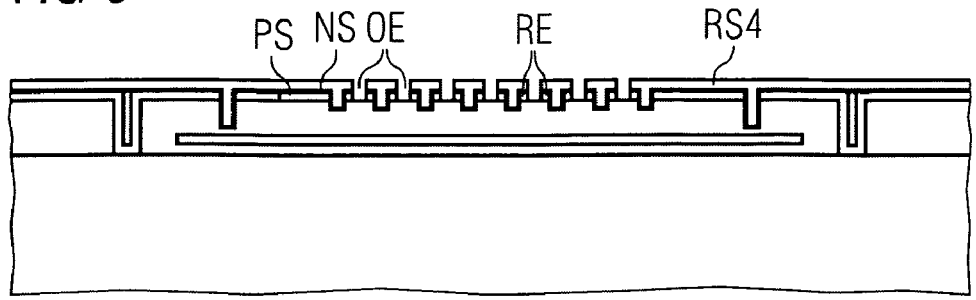

In the next method step, illustrated in FIG. 9, a pattern of openings OE is then etched through the covering layer, which comprises second polysilicon layer PS and silicon nitride layer NS, in the region of the back electrode RE. In this case, the openings are arranged between the spacers. The openings OE are preferably likewise produced in the form of blind holes with an arbitrary, e.g. round or rectangular, cross section. The depth of the blind holes is not critical in this case, such that an arbitrary, if appropriate also nonspecific, etching method can be used. A further resist layer RS4 is used here for the patterning.

In the next step, the material of the sacrificial layers is removed in the region of membrane ME and back electrode RE. In this case, the region between membrane ME and covering layer is accessible through the openings OE. On account of the relatively small distance between membrane ME and surface of the base chip, the material of the sacrificial layer is etched below the membrane however preferably from the side of the base chip BC. For this purpose, a perforation DB is produced in the base chip BC from the rear side or underside, the surface of the bottommost sacrificial layer being uncovered in said perforation. The perforation corresponds in cross section approximately to the size of the back electrode, but in any event has a smaller cross-sectional area than the membrane ME, such that the membrane can bear on the base chip in an edge region around the perforation DB.

The perforation DB can be produced by means of anisotropic etching methods, the approximately vertical sidewalls illustrated being obtained. However, it is also possible to use a crystal-axis-specific etching method, oblique sidewalls also be obtained in a crystalline material of the base chip such as in silicon, for example. The etchant can then attack from above and below, such that after the bottommost sacrificial layer has been stripped out, the membrane ME then bears freely on the base chip and no longer has a fixed connection to the base chip. The sacrificial layers lying above the membrane ME are also stripped out completely, resulting in the cutout AN that is completely delimited by the trench GR filled with polysilicon.

An etching method specific toward silicon nitride and polysilicon is used for etching the sacrificial material, such that the polysilicon in the trench GR can serve as an etching stop.

Figure 10:
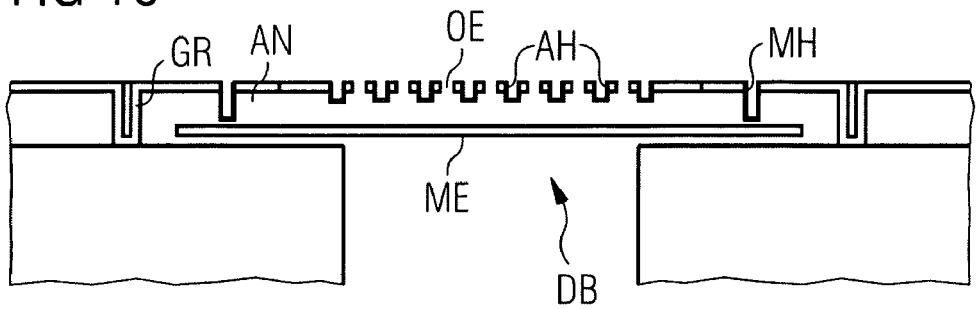
Figure 11:
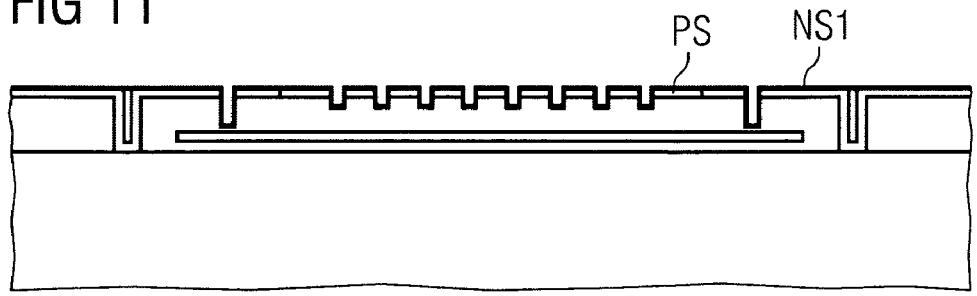
FIGS. 11 to 15 show various method stages in accordance with a further production variant.

FIG. 10 shows the MEMS sensor thus completed with a freely vibrated membrane ME, formed from electrically conductive polysilicon, and the back electrode RE, which is applied as an electrically conductive partial layer composed of polysilicon on the mechanically stable silicon nitride layer and together with the latter forms the covering layer. The membrane holders MH fix the membrane ME in the edge region on the surface of the base chip, while the spacers AH at a sufficient distance from the membrane prevent direct contact between the membrane ME and the second polysilicon layer PS of the covering layer in the event of excessively great deflection of the membrane ME.

Outside the cutout AN enclosed by the trench GR, the layer construction SA is intact or has not been attacked by one of the etching steps. It surrounds the cutout in a stabilizing manner and predefines the level for the covering layer which bears thereon and is approximately planar outwardly and at the top. With the exception of the membrane holders and spacers positioned only in punctiform fashion, the covering layer comprising silicon nitride layer and second polysilicon layer is likewise planar and formed with an approximately conformal layer thickness. Tensile and compressive stresses can therefore be distributed uniformly and are compensated for by support on the remaining layer construction SA, such that the covering layer and in particular the back electrode are not subjected to any flexures whatsoever in the direction of the membrane ME. The bracing of the covering layer with the remaining layer construction SA has the effect that the silicon nitride layer affording mechanical stability can be made thinner than known previously. A sufficient stiffness of the covering layer is nevertheless obtained. Whereas for example a non-stoichiometric silicon nitride with silicon excess in a layer thickness of approximately 1.5 μm was used in known MEMS microphones, which produces a stress of approximately 100 MPa, in comparison therewith a stoichiometric standard silicon nitride in a layer thickness of approximately 0.5 μm can now be used, which admittedly produces a stress of approximately 1.3 GPa yet the latter can nevertheless be compensated for harmlessly without warpage of the covering layer by means of the construction proposed. The thinner material layer enables material and time to be saved during production and patterning. Therefore, an MEMS sensor according to the invention can also be realized more cost-effectively.

Figure 12:
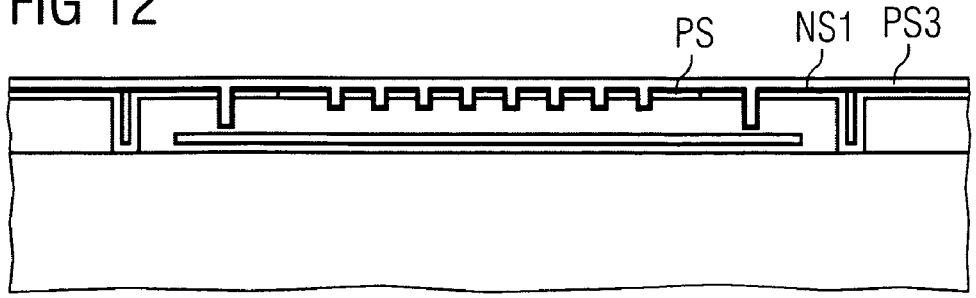
Figure 13:
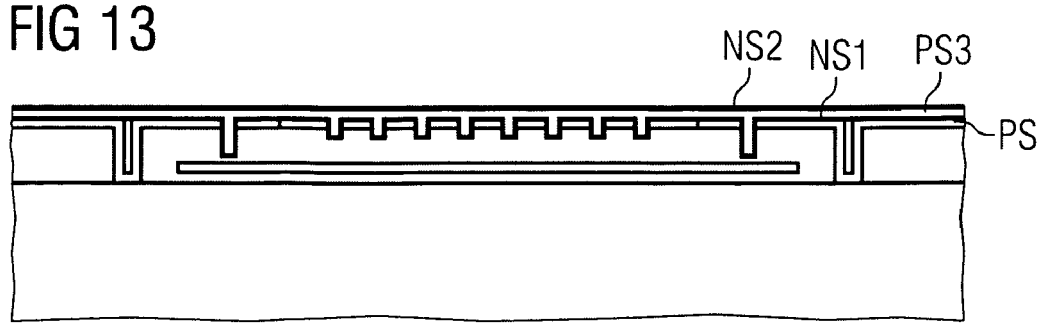

A method variant for producing an MEMS sensor with a symmetrically constructed covering layer is explained with reference to FIGS. 11 to 15. Proceeding from the method stage— illustrated in FIG. 11— after the deposition of a first silicon nitride layer NS 1 (corresponding to the silicone nitride layer NS of FIG. 8), in the next step, firstly a further polysilicon layer PS3 is applied in edge-covering fashion above the silicon nitride layer NS1 and, if appropriate, is subsequently planarized. FIG. 12 shows the arrangement at this method stage. A second silicon nitride layer NS2 is then produced above the planar surface, preferably with the same layer thickness as the first silicon nitride layer NS1, as shown on FIG. 13.

Figure 14:
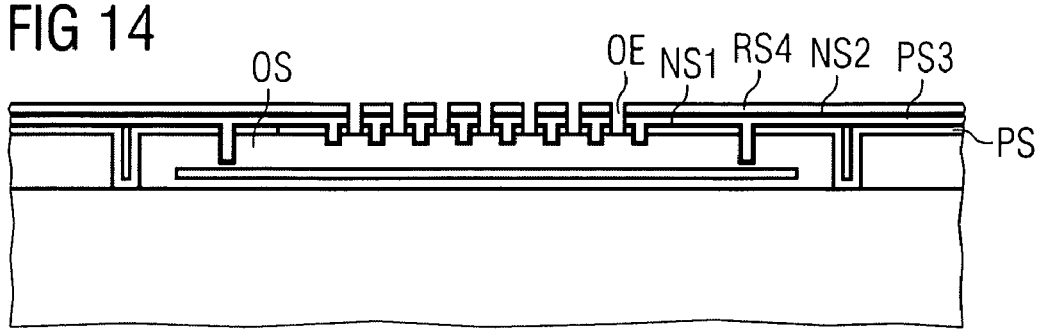

In a manner similar to that in FIG. 9, openings OE are then etched into this triple layer, which is even a quadruple layer by virtue of the underlying second polysilicon layer PS, with the aid of a resist layer RS4, as shown in FIG. 14. The depth of the openings is dimensioned such that the surface of the sacrificial layer is uncovered at the bottom of said openings. Here, too, an excessively deep etching is harmless, provided that it remains in the region of the sacrificial layer OS.

Figure 15:
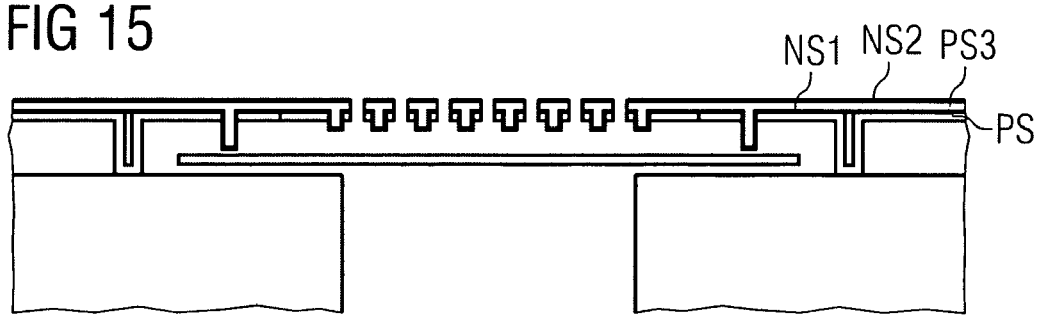

In a manner similar to that explained with reference to FIG. 10, here as well a perforation DB is then produced at the base chip BC below the membrane ME and the sacrificial material is subsequently stripped out in the region of the cutout, as shown in FIG. 15. Here, too, a suitable selective etching method can be used for this purpose. If a highly doped silicon oxide layer, and for example phosphosilicate glass, is used as sacrificial layer, then a wet-chemical etching method based on hydrofluoric acid can be carried out. However, it is also possible to carry out the etching method with gaseous hydrogen fluoride gas. In this case, it is advantageous for the material of the sacrificial layers not to be doped excessively highly, in order, during the gas phase etching, not to obtain any solid by-products of the hydrogen fluoride gas with the dopants, which could form undesirable residues in the region of the cutout.

FIG. 15 shows the structure—completed after said etching step—of an MEMS sensor with a covering layer comprising a silicon nitride/polysilicon/silicon nitride triple layer.

The electrical connections of the MEMS sensor, which are not illustrated in the figures, are concomitantly patterned during the patterning steps for the polysilicon layer of the membrane ME and the second polysilicon layer PS forming the back electrode RE. In particular, electrical leads that are electrically connected to corresponding connecting pads are produced in this case. Said connecting pads can be produced on the surface of the layer construction. However, it is also possible to arrange the connections partly or completely on the surface of the base chip. For this purpose, outside the sensor region illustrated in the figures, the layer construction is removed in places to an extent such that the surface of the base chip is uncovered. The corresponding electrical connecting pads, in particular bondable surfaces, are produced there and connected to second polysilicon layer PS and membrane ME in a suitable manner.

While the production method is carried out at the wafer level in parallel for a multiplicity of individual sensors, the singulation into individual sensor elements can be effected in a last step, in which case a sawing method, for example, can be used for separation.

Figure 16A:
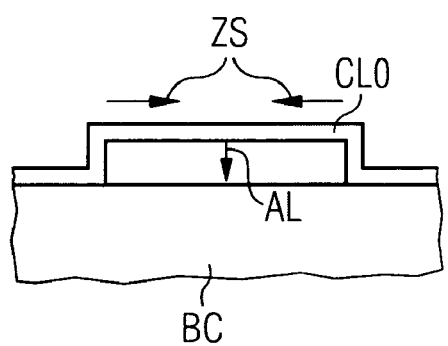
FIGS. 16A and 16B show a representation of the tensile and compressive stresses occurring in an MEMS sensor in comparison with known sensors.

FIGS. 16A and 16B again show the advantages or advantageous effects of the construction according to the invention in comparison with known sensor constructions. FIG. 16A schematically shows a known covering layer CL0 which is seated on a base chip and which has a 3D construction in the region of the sensor and is elevated or bulges outward over the surface of the base chip. The production-dictated tensile stresses ZS, produced in particular during the deposition of the silicon nitride layer, are illustrated by two horizontally arranged arrows. They have the effect that the three-dimensional construction of the covering layer can warp in known sensors, which results in a deflection AL of the covering layer toward the surface of the base chip BC or the moveable electrode arranged there. Said deflection is indicated by arrows AL.

Figure 16B:
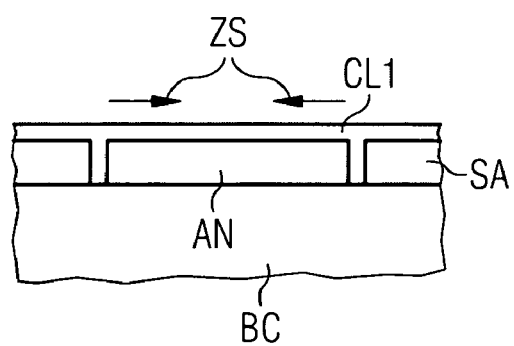

By contrast, FIG. 16B schematically shows the construction of an MEMS sensor according to the invention, in which the covering layer CL1 DS, which is formed in planar fashion approximately throughout, bears on a remaining layer construction SA on all sides. The tensile stresses ZS that occur here, too, are thereby compensated for and lead to no deflection whatsoever of the covering layer in the region of the cutout AN. As a result, the sensor dimensions remain constant, in particular the distance between back electrode RE and moveable electrode, for example membrane ME. A distance between back electrode and membrane that can be set in a reliable manner enables an exact measurement of the physical quantity observed, for example of the sound pressure acting on the membrane.

The invention is not restricted to the exemplary embodiments illustrated. The precise structure and the precise construction of MEMS sensors according to the invention is defined solely by the claims and can deviate from the embodiments illustrated.

The invention claimed is:

1. An MEMS sensor having a capacitive mode of operation, comprising:
   a base chip;
   a patterned layer construction applied on a surface of the base chip;
   a cutout in the layer construction, said cutout being surrounded by an edge region of the layer construction;
   a moveable electrode, which is arranged in the cutout and is connected to the layer construction; and
   a covering layer, which comprises a back electrode, bears on the layer construction around the cutout and spans the cutout;
   wherein the covering layer or a partial layer of the covering layer comprises a portion extending to the base chip and surrounding the cutout within the layer construction.

2. The MEMS sensor as claimed in claim 1,
   wherein the covering layer comprises an electrically conductive partial layer in the region of the cutout.

3. The MEMS sensor as claimed in claim 2,
   wherein the covering layer comprises a partial layer composed of polysilicon.

4. The MEMS sensor as claimed in claim 1, wherein
   a top side of the covering layer in the region of the cutout and the edge region surrounding the cutout lies at the same level above the surface of the base chip.

5. The MEMS sensor as claimed in claim 2, wherein
   the electrically conductive partial layer of the covering layer is formed from polysilicon.

6. The MEMS sensor as claimed in claim 1, wherein
   the covering layer has a pattern of openings (OE) in the region of the cutout.

7. The MEMS sensor as claimed in claim 1, wherein
   the covering layer comprises a silicon nitride layer.

8. The MEMS sensor as claimed in claim 7, wherein
   the covering layer comprises two silicon nitride layers between which a polysilicon layer (PS) is arranged.

9. The MEMS sensor as claimed in claim 1, wherein
   the moveable electrode is formed as a membrane and the covering layer or the partial layer of the covering layer, in the edge region but within the cutout, has protuberances in the direction of the base chip which reach as far as directly over the membrane.

10. The MEMS sensor as claimed in claim 1, wherein
    a membrane is arranged above a perforation leading through the entire thickness of the base chip.

* * * * *

UNITED STATES PATENT AND TRADEMARK OFFICE
CERTIFICATE OF CORRECTION

| | |
|---|---|
| PATENT NO. | : 7,923,792 B2 |
| APPLICATION NO. | : 12/087712 |
| DATED | : April 12, 2011 |
| INVENTOR(S) | : Franz Schrank |

It is certified that error appears in the above-identified patent and that said Letters Patent is hereby corrected as shown below:

Title page, item
(73)    ~~austruamicrosyotems AG~~ should read as follows: --<u>austriamicrosystems AG</u>, Unterpremstätten (AT)--

Signed and Sealed this
Twenty-eighth Day of June, 2011

David J. Kappos
*Director of the United States Patent and Trademark Office*